United States Patent [19]

Abbas et al.

[11] 4,424,621
[45] Jan. 10, 1984

[54] METHOD TO FABRICATE STUD STRUCTURE FOR SELF-ALIGNED METALLIZATION

[75] Inventors: Shakir A. Abbas, Wappingers Falls; Ingrid E. Magdo, Hopewell Junction, both of N.Y.

[73] Assignee: International Business Machine Corporation, Armonk, N.Y.

[21] Appl. No.: 335,894

[22] Filed: Dec. 30, 1981

[51] Int. Cl.³ .................... H01L 21/302; H01L 21/76
[52] U.S. Cl. .................................. 29/571; 29/576 W; 29/577 C; 29/578; 29/580; 29/591; 148/1.5; 148/187; 156/643; 156/648; 156/653; 156/657; 357/49; 357/50; 357/59; 357/68; 427/88
[58] Field of Search ............... 29/571, 576 W, 577 C, 29/578, 580, 591; 148/1.5, 187; 156/643, 648, 653, 657; 427/88; 357/49, 50, 59, 68

[56] References Cited

U.S. PATENT DOCUMENTS

| 4,062,699 | 12/1977 | Armstrong | 148/1.5 |
| 4,201,603 | 5/1980 | Scott, Jr. et al. | 148/174 |
| 4,209,349 | 6/1980 | Ho et al. | 148/187 |
| 4,209,350 | 6/1980 | Ho et al. | 148/188 |
| 4,211,582 | 7/1980 | Horng et al. | 29/580 X |
| 4,234,362 | 11/1980 | Riseman | 148/187 |
| 4,256,514 | 3/1981 | Pogge | 148/1.5 |
| 4,322,883 | 4/1982 | Abbas et al. | 156/643 X |
| 4,359,816 | 11/1982 | Abbas et al. | 29/578 X |

OTHER PUBLICATIONS

Feth et al., "Thin-Base Lateral PNP Transistor Structure", I.B.M. Tech. Discl. Bull., vol. 22, No. 7, Dec. 1979, pp. 2939-2942.
H. B. Pogge, IBM Technical Disclosure Bulletin, "Narrow Line-Width Masking Method", Nov. 1976, vol. 19, No. 6, pp. 2056-2058.
S. A. Abbas et als., IBM Technical Disclosure Bulletin, "Extending the Minimal Dimensions of Photolithographic ... ", Sep. 1977, vol. 20, No. 4, pp. 1376-1378.
"A New Edge-defined Approach for Sub-micrometer MOSFET Fabrication", by W. R. Hunter et als., IEEE Electron Device Letters, vol. EDL-2, No. 1, Jan. 81, pp. 4-6.
"Sub-micrometer Polysilicon Gate CMOS/SOS Technology", by A. C. Ipri et als., IEEE Transactions on Electron Devices, vol. ED-27, No. 7, Jul. 80, pp. 1275-1279.
"A Novel Sub-micron Fabrication Technique", by T. N. Jackson et al., IEDM 1979 Conference Volume, pp. 58-61.

*Primary Examiner*—W. G. Saba
*Attorney, Agent, or Firm*—George O. Saile

[57] ABSTRACT

A self-aligned metal process is described which achieves self-aligned metal silicon contacts and micron-to-submicron contact-to-contact and metal-to-metal spacing by use of the pattern of dielectric material having a thickness in the order of a micron or less. The pattern of recessed oxide isolation to device area is also self-aligned by this process. The process results in substantially planar integrated circuit structure. The process is applicable to either a bipolar integrated circuit either bipolar or MOS field effect transistor integrated circuits.

25 Claims, 10 Drawing Figures

METHOD TO FABRICATE STUD STRUCTURE FOR SELF-ALIGNED METALLIZATION

DESCRIPTION

Technical Field

This invention relates to methods and resulting structures for manufacturing integrated circuit devices and more particularly to a self-aligned metal process which achieves self-aligned metal to silicon contacts, self-aligned recessed oxide isolation, and sub-micrometer contact-to-contact and metal-to-metal spacing wherein the insulation between the contacts is a pattern of dielectric material having a thickness dimension in the order of less than about 2000 nanometers.

CROSS REFERENCES TO RELATED APPLICATIONS (1) Patent application Ser. No. 335,891, filed 12/30/81, entitled "Sub-micrometer Channel Length Field Effect Transistor Process and Resulting Structure", by R. C. Dockerty.

(2) Patent application Ser. No. 335,953, filed 12/30/81, entitled "MOSFET Structure and Process to Form Micrometer Long Source/Drain Spacing", by R. C. Dockerty and F. H. De La Moneda.

(3) Patent application, Ser. No. 335,892, filed 12/30/81 entitled "Self-aligned Field Effect Transistor Process", by J. Riseman.

(4) Patent application, Ser. No. 335,893, filed 12/30/81, entitled "Fabrication Process of Sub-Micrometer Channel Length MOSFET", by J. Riseman and P. J. Tsang.

BACKGROUND ART

The integrated circuit technology has a need to obtain narrow line widths in the range of 1 micrometer or less by extending standard photolithography techniques and avoiding the need to use the more expensive and complex techniques such as electron beam or X-ray lithography. One such technique is described in H. B. Pogge in IBM Technical Disclosure Bulletin, November 1976, Vol. 19, No. 6, pp. 2057-2058, entitled "Narrow Line Widths Masking Method". This method involves the use of a porous silicon followed by the oxidation of the porous silicon. Another technique described by S. A. Abbas et al. in the IBM Technical Disclosure Bulletin, Vol. 20, No. 4, September 1977, pp. 1376-1378. This method describes the use of polycrystalline silicon masking layers which are made into a mask by first using an intermediate mask of oxidation blocking material, such as silicon nitride in the formation of polycrystalline silicon. Line dimensions below about 2 micrometers may be obtained by this technique.

U.S. Pat. Nos. 4,209,349 and 4,209,350 by I. T. Ho et al., U.S. Pat. No. 4,234,362 by J. Riseman and U.S. Pat. No. 4,256,514 by H. B. Pogge describe methods for forming narrow dimensioned, for example, sub-micrometer regions on a silicon body. These patents all involve the formation of substantially horizontal surfaces and substantially vertical surfaces on a silicon body and then forming a layer of a very narrow dimension on both the substantially horizontal and substantially vertical surfaces. This layer is then subjected to an anisotropic etching process such as by reactive ion etching, to substantially remove the horizontal layer while leaving the vertical layer substantially intact. The vertical layer dimension is adjusted depending upon the original thickness of the layer applied. In this way such a narrow dimension region as 1 micrometer or less is obtained.

There has been significant effort in the integrated circuit field to develop processes for making sub-micrometer channel length field effect transistors with a high degree of channel length control. Examples of this work are described in "A New Edge-defined Approach for Sub-micrometer MOSFET Fabrication" by W. R. Hunter et al., IEEE Electron Device Letters, Vol. EDL-2 No. 1, January 1981, pp. 4-6, "Sub-micrometer Polysilicon Gate CMOS/SOS Technology" by A. C. Ipri et al. published in IEEE Transactions on Electron Devices, Vol. ED-27, No. 7, July 1980, pp. 1275-1279 and "A Novel Sub-micron Fabrication Technique" by T. N. Jackson et al. published in IEDM 1979 Conference Volume, pp. 58-61. The first paper relies on the reactive ion etching technique to form a sidewall silicon dioxide. The second paper utilizes a technique involving lateral diffusion of boron. The third method uses the plating of a metal on the edge of a conventionally patterned metal layer. Other short channel field effect transistor devices are illustrated in the W. E. Armstrong U.S. Pat. No. 4,062,699; J. Goel U.S. Pat. No. 4,145,459 and J. H. Scott, Jr. U.S. Pat. No. 4,201,603. The Armstrong patent utilizes an ion implantation and diffusion process to narrow the channel length of his MOSFET. The Goel patent utilizes a process sequence that involves the use of a recess formed in the portion of the semiconductor body and further involves the plating of metal films on each side of the recess until the spacing between the metal film across the recess is equal to desired length of the gate. The Scott, Jr. patent controllably doped an edge of polysilicon layer and then is able to remove the undoped polysilicon by etching it with a material which does not etch the doped polysilicon region.

U.S. Pat. No. 4,319,932 to C. G. Jambotkar; pending patent application Ser. No. 167,184 filed July 8, 1980 by G. R. Goth, I. E. Magdo and S. D. Malaviya; and U.S. Pat. No. 4,322,883 to S. A. Abbas and I. E. Magdo relate to the fabrication of bipolar integrated circuit structures and devices which have contacts to the elements of the devices in close proximity to one another and in self-aligned manner. The G. R. Goth et al. patent application and S. A. Abbas et al patent describe self-aligned metal processes which achieve self-aligned metal silicon contacts and micron to sub-micron contact-to-contact and metal-to-metal spacing by use of a pattern of dielectric material having a thickness of the order of a micron or less. The C. G. Jambotkar patent employs a doped polycrystalline silicon base contact formed close to the emitter openings in a self-aligned manner wherein the isolation between the base contact and emitter contact is a layer of thermally grown silicon dioxide on the surface of the polycrystalline silicon base contact. U.S. Pat. No. 4,359,816 to S. A. Abbas and I. E. Magdo describe a related process and resulting integrated circuit structure which involves the formation of field effect transistors which achieve self-aligned metal or polycrystalline silicon contacts and micron-to-sub-micron contact-to-contact and metal-to-metal spacing by use of a pattern of dielectric material having a thickness of the order of a micron or less.

It is desirable to provide a high density integrated circuit device structure whether the devices are bipolar or field effect transistors that is useful in memory or logic. It is also useful to have the processing to be as simple as possible. The self-aligned recessed oxide isolation to the device areas is also important in reducing the spacing between devices which in turn increases the density of devices within an integrated circuit.

SUMMARY OF THE PRESENT INVENTION

In accordance with the present invention, a self-aligned metal process is described which achieves self-aligned metal silicon contacts and micron-to-submicron contact-to-contact and metal-to-metal spacing by use of the pattern of dielectric material having a thickness in the order of a micron or less. The pattern of recessed oxide isolation to device area is also self-aligned by this process. The process results in substantially planar integrated circuit structure. The process is applicable to either a bipolar integrated circuit either bipolar or MOS field effect transistor integrated circuits.

The method for forming bipolar integrated circuits having a pattern of narrow dimension dielectric regions on a monocrystalline semiconductor, preferably silicon, body involves providing the silicon body and forming a first insulating layer on a major surface of the body. A silicon nitride oxidation resistant second insulating layer is formed over the first layer. A polycrystalline silicon layer is deposited over the silicon nitride layer. A oxidation resistant third insulating layer is formed over the polycrystalline silicon layer. The third insulating layer and the polycrystalline silicon layer are removed down to the silicon nitride layer to produce substantially vertical sidewalls on the remaining third insulating layer and polycrystalline silicon layer. The areas of the third insulating layer and polycrystalline silicon layer which are removed are those areas designated to be at least the emitter region element of the bipolar devices. The exposed sidewalls of the polycrystalline silicon layer are thermally oxidized to produce a silicon dioxide sidewall layer thereon. The exposed silicon nitride layer is removed. The emitter is formed in the exposed silicon substrate by either diffusion or ion implantation techniques. The remaining third insulating layer and polycrystalline silicon layer are removed to leave the remaining portions of the silicon dioxide sidewall layer extending above the silicon substrate. Openings are formed in the first insulating layer to the elements of the bipolar device and a conductive layer is formed on the silicon body which has portions thereof electrically separated by the silicon dioxide sidewall layer for contacting the elements of the bipolar devices. It is preferred that isolation regions between devices are self-aligned with the bipolar devices. This self-alignment can be made by removing the second insulating layer and polycrystalline silicon layer in regions designated to be the pattern of isolation between devices and between the base and collector reach-through regions. Anisotropic etching is utilized to form openings into the silicon substrate using the remaining second insulating layer and polycrystalline silicon layer as a mask. The grooves are then filled with dielectric isolation material to cause the isolation pattern to be formed.

The method of forming a self-aligned metallization for MOS field effect transistor integrated circuit devices begins by first forming a first insulating layer on the surface of the monocrystalline silicon device. A second insulating layer of silicon nitride is formed over the first insulating layer. A layer of polycrystalline silicon is formed over the silicon nitride layer. A third insulating layer is formed over the polycrystalline silicon. The third insulating layer and the polycrystalline silicon layer are removed down to the silicon nitride layer to produce substantially vertical sidewalls on the remaining third insulating layer and polycrystalline silicon layer. These layers are removed in areas designated to be at least the source/drain regions for the field effect transistor devices in the integrated circuit. The exposed sidewalls of the polycrystalline silicon layer are exposed to thermal oxidation ambient to produce a silicon dioxide sidewall layer thereon. The exposed silicon nitride layer is removed. The source/drain regions in the silicon substrate are formed by conventional ion implantation or diffusion techniques. The remaining third insulating layer and polycrystalline silicon layers are removed to leave the remaining portions of the silicon dioxide sidewall layer extending above the silicon substrate. Openings are formed in the first insulating layer to the elements of the field effect transistor devices. A substantially planar conductive layer is formed on the silicon body which has portions thereof electrically separated by the silicon dioxide sidewall layer for contacting the elements of the field effect devices.

DISCLOSURE OF THE INVENTION

Figure 1:
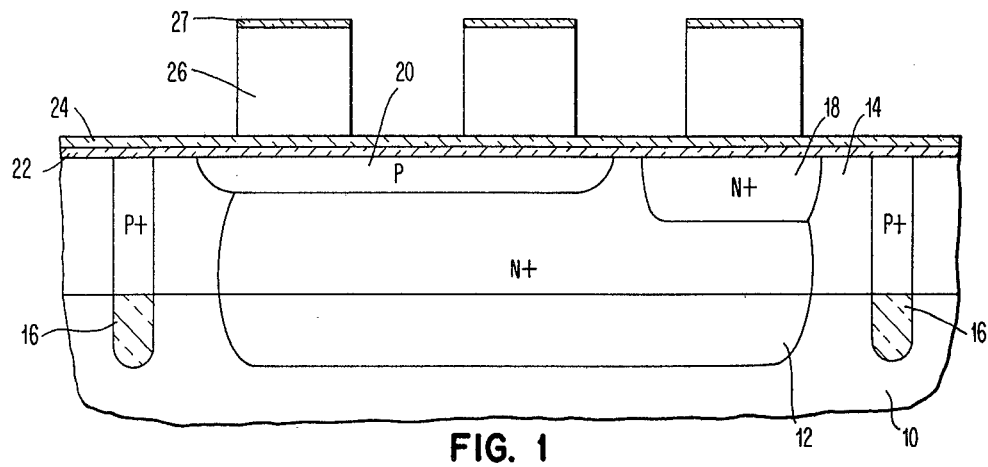
FIGS. 1 through 4 schematically illustrate the fabrication method for forming bipolar devices according to the one embodiment of the present invention.

Referring now more particularly to FIGS. 1 through 4 there is illustrated an embodiment for utilizing the self-aligned metal process to form a bipolar integrated circuit. The process is illustrated to form NPN bipolar device integrated circuits. However, it would be obvious that PNP bipolar devices can alternatively be formed by simply reversing the polarities of the various elements of the transistors in associated regions. The FIG. 1 illustrates one small, greatly enlarged portion of the silicon body which will be used to form a very dense bipolar transistor structure. The P-substrate has a subcollector N+ diffusion 12 made therein. An epitaxial N layer 14 is then grown on top of the substrate. These processes are standard processes in the formation of, for example, NPN bipolar transistors. The substrate is typically <100> crystallographic oriented silicon wafer having resistance of the order of 1 to 20 ohms centimeters. The subcollector diffusion is typically formed using arsenic having a surface concentration of about $10^{20}$ atoms/cm$^2$. The epitaxial growth process to form layer 14 may be done by conventional techniques, such as the use of silicon tetrachloride/hydrogen or silane/hydrogen mixtures at temperatures about 1000° C. to 1200° C. During the epitaxial growth, the dopant in the N+ subcollector layer moves into the epitaxial layer to complete the formation of the subcollector layer. The thickness of the epitaxial layer for highly dense integrated circuits is of the order of 3 micrometers or less. P+ regions 16 can also be formed in the substrate 10 in the designated areas under which the recessed silicon dioxide isolating regions are to be formed. These regions also outdiffuse into the epitaxial layer as is grown. The P+ regions 16 prevent the surface inversion and current leakage underneath the recessed oxide. The N+ collector reach-through 18 to the subcollector region 12 using silicon dioxide as the masking layer with standard lithography, etching and diffusion or ion implantation techniques. The N+ region 18 is typically formed with a phosphorous or arsenic dopant.

The P base region 20 is formed at this time using silicon dioxide masking with standard lithography, etching and diffusion or ion implantation techniques. The masking layers are now removed. The typical dopant is boron and has a surface concentration of $1 \times 10^{18}$ atoms/cm$^2$.

A first insulating layer of typically thermally grown silicon dioxide layer 22 is formed on the surface of the silicon body. A chemical vapor deposited second insulating layer of preferably silicon nitride 24 is formed on the first insulating layer. These insulating layers may be alternatively one of or a combination of known insulating materials such as silicon dioxide, silicon nitride, aluminum oxide or the like in addition to thermally grown silicon dioxide. The silicon dioxide layer 22 may be thermally grown in an oxygen or oxygen-water vapor ambient at a temperature of about 925° C. The second method for growing silicon dioxide involves the use of a chemical vapor deposition process wherein silane and oxygen at about 450° C. ambient is utilized or a SiH$_2$Cl$_2$ and nitrous oxide at a temperature of about 800° C. under atmospheric or low pressure growth conditions. The deposition of silicon nitride is usually formed by chemical vapor deposition using the process that includes silane, ammonia and nitrogen carrier gas at a temperature of about 800° C. under atmospheric or low pressure conditions as described more fully in the V. Y. Doo U.S. Pat. No. 4,089,992.

A layer 26 of polycrystalline silicon is now deposited over the entire wafer by using, for example, silane in hydrogen in a hydrogen ambient in a temperature range of about 200° C. to 800° C. The operative thickness of the polycrystalline silicon is between about 500 to 1500 nanometers and 1000 nanometers is preferred. Should the thickness be greater than about 2000 nanometers, planarity problems arise for multi-level planarization. If the thickness is less than about 500 nanometers isolating the metal lines will be difficult and also the planarity will be effected.

The polycrystalline silicon makes no electrical contact to the silicon body since it is formed upon the two insulating layers 22, 24.

The structure is placed in a chemical vapor deposition ambient to form the third insulating layer, such as silicon nitride layer 27 on the surface of the polycrystalline silicon layer. Standard lithography and etching techniques may be utilized to form openings in the silicon nitride layer 27 over the areas which are designated to be at least the emitter areas. The combinations of silicon nitride/silicon dioxide can be utilized in place of this silicon nitride layer. The thickness of the second insulating layer is typically 50 to 200 nanometers. The structure is placed in reactive ion or plasma etching environment for polycrystalline silicon having typically the conditions of, for example, chlorine-argon or carbon tetrachloride-argon ambient, RF parallel plate structure having 10 microns pressure, 0.16 watts/cm$^2$ power density and 10 cc/min flow rate and using the apparatus described in the Harvilchuck et al. patent application Ser. No. 594,413, filed July 9, 1975, and continuing patent application Ser. No. 822,775, filed Aug. 8, 1977 and continuation patent application Ser. No. 960,322 filed Nov. 13, 1978. The reactive ion etching process is completed when the dielectric layer 24 is reached. The etch ratio of $$\frac{\text{polycrystalline silicon}}{\text{SiO}_2 \text{ (or Si}_3\text{N}_4)} \geq \frac{10}{1}$$

for polycrystalline silicon reactive ion etching. It is preferred to also have openings in the layers 26, 27 in areas where it is desired to have recessed oxide isolation. The great advantage to this process is that the recessed oxide isolation is self-aligned to the device areas and thereby reducing the required space between the device areas and increasing the density of devices in the integrated circuit chip. FIGS. 1 to 4 embodiment illustrates this alternative. A resist layer is deposited, exposed and developed so as to leave block-out resist layer (not shown) to cover the designated emitter area and all other designated N regions, such as, Schottky barrier diodes, resistors, etc. The silicon nitride layer 24 and silicon dioxide layer 22 are etched in the areas wherein the recessed oxide isolation is desired. The epitaxial silicon layer 14 is etched using reactive ion etching. The requirement is vertical sidewalls, which can be achieved in CF$_4$+H$_2$ or in SF$_6$+Cl$_2$ ambient.

Figure 2:
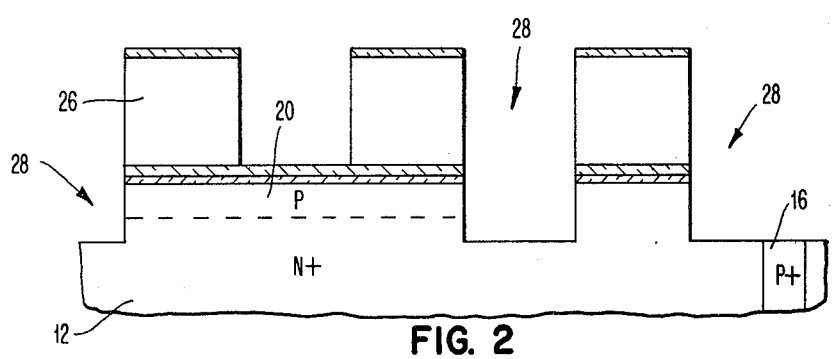
Figure 3:
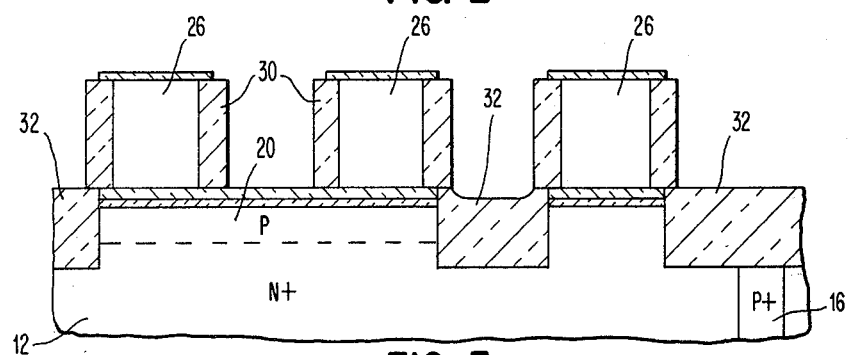

The etching of the silicon is to a depth of between about 0.3 to 1.0 micrometers and preferably 0.45 micrometers to produce the FIG. 2 structure having grooves 28 therein. It should be noted that the base region 20 now preferably abutts the grooves 28 which will eventually be filled with dielectric material.

The third insulating layer 27 has to be thick enough to have at least 50 nanometers remaining after the silicon plasma reactive ion etching process.

The next steps are utilized to form the sidewall layer 30 and the recessed oxide isolation regions 32. It is preferred to use a high pressure oxidation process which operates at a low temperature of between about 600° to 950° C. to achieve a thickness of between about 0.6 to 2.0 micrometer of silicon dioxide on the sidewall layer 30 and to fill the recess oxide isolation region 32. For example, at 25 atmospheres and 800° C. ambient the thickness of silicon dioxide after 2 hours is about 1 micron. For more details of this process see, Low Temperature, High Pressure Steam Oxidation of Silicon, by Katz and Howells, published in J. of Electrochemical Soc., October 1979, p. 1822.

The silicon nitride layer 24 and silicon dioxide layer 22 are now removed in the emitter areas using a standard lithography and etching technique. The emitter 34 is either implanted through a screen oxide or is diffused directly into the base region 20. The exposed silicon surfaces are now oxidized to form a silicon dioxide layer thereover. The remaining polycrystalline silicon layer 26 and silicon nitride layer 27 are removed by suitable etching techniques such as hot phosphoric acid for the silicon nitride and pyrocatechol for the polycrystalline silicon to result in the free standing sidewall layers 30.

The base contact areas are opened by conventional etching techniques as well as other suitable contacts, such as Schottky barrier diodes (not shown). A blanket coating of metal 40 is deposited over the pattern of narrow dimensioned dielectric sidewall regions 30. The preferred metal layer is formed of aluminum-copper by evaporation or sputtering. The blanket metal layer is deposited over the narrow dimensioned dielectric regions 30 and in the areas between so that the areas between the narrow dimensioned dielectric regions are uncovered with the insulating layer electrical contacts are made to the monocrystalline silicon body elements therein. The surface of the structure is planarized, for example, by a blanket deposition of a plastic material over the metal layer. This plastic material can typically be a photoresist or polyimide material or the like. The plastic material is deposited using the spin-on technique as is common practice for photolithography resist or polyimide applying processes. Commercially available 1.0–2.0 micrometer grade photoresist is typically used, and is applied at a spin speed of 3000–4000 rpm yielding a nominal film thickness of 1.3 to 1.5 micrometers. The plastic layer thickness over the dielectric stud is typically 1000–3000 Å.

The planarized structure is placed in a reactive ion etching ambient. Etching is performed in an oxygen ambient for all plastic layers removing 3000–5000 Å. The conductive layer is exposed over the dielectric layer 30, but is not attacked by the oxygen etch. Subsequently, the metal over the dielectric layer 30 is removed by conventional wet chemical etch, plasma etch, or reactive ion etching. During this etch the retained plastic layer serves to mask the off-stud regions of the conductive layer. Alternatively, the reactive ion etching may uniformly etch the plastic and the metal layer until the tops of the narrow dimensioned dielectric regions 30 are reached. The remaining plastic material is removed by, for example, oxygen ashing, or other suitable processes. Ashing of photoresist is accomplished in an oxygen ambient using a commercially available barrel type plasma etch tool operated at 300–400 watts for 30–60 minutes.

Figure 4:
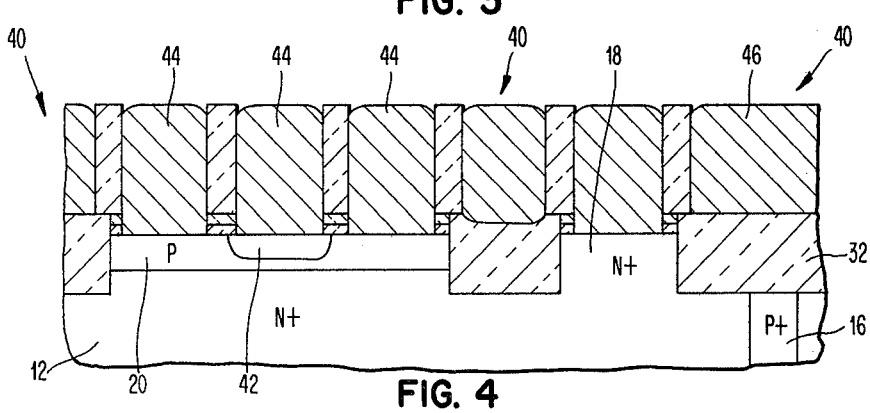

The result of the process is the substantially planar structure of FIG. 4 wherein the emitter contact is 42, the base contact is 44 and the collector contact is 46. The metal lines 40 over the isolation regions may be used as interconnect metallization.

The resulting self-aligned metal structure places the metal over the base contact to within about 3500 Å from the edge of the emitter, thereby essentially eliminating the extrinsic base resistance of the device. Reduction of the base resistance is one of the primary goals for enhanced bipolar device performance. The reduction of base resistance achieved with this technique is superior over prior art structures which use doped polycrystalline silicon, or metal silicides of polycrystalline silicon to reduce the extrinsic base resistance.

The layout allows the metal over the N+ emitter region to be isolated from the metal over another N+ region, that is the collector, and from the P base region in between with submicron metal-to-metal spacing.

Passivation and interconnection metallurgy layers (not shown) are now provided over the FIG. 4 structure to passivate and interconnect the devices into the desired integrated circuit. The passivation materials are typically sputtered or plasma silicon dioxide, plasma silicon nitride, polyimide or a combination of these materials. The metallurgy is typically aluminum, aluminum-copper or the like.

Figure 5:
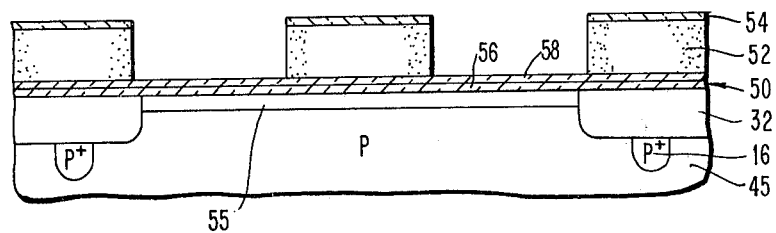
FIGS. 5 through 7 illustrate a first embodiment of forming a MOS field effect transistor integrated circuit.
Figure 6:
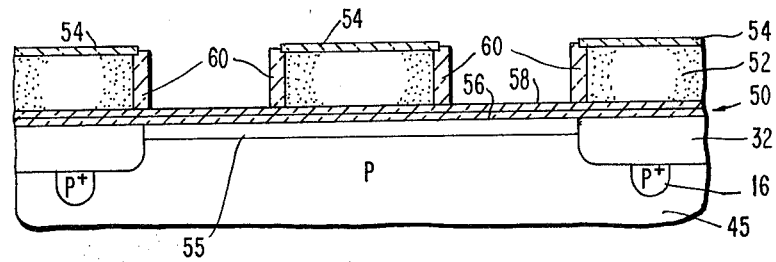
Figure 7:
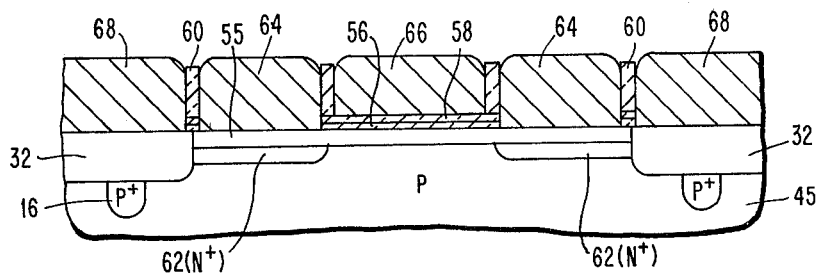

Referring now more particularly to FIG. 5 through 7 there is illustrated a first embodiment for utilizing the self-aligned metal process to form field effect transistor integrated circuits. The process is illustrated to form N channel MOSFET field effect transistor integrated cicuits. However, it would be obvious that P channel field effect transistors can alternatively be formed by simply reversing the polarities of the various elements of the transistors and associated regions. The FIG. 5 illustrates one small, greatly enlarged portion of a silicon body which will be used to form a very dense field effect transistor integrated circuit structure. P type substrate of monocrystalline silicon substrate 45 having a 10–20 ohm/cm resistivity is the basic foundation structure for the process. P+ substrates with low doped P epitaxy can also be utilized.

The process for forming the recessed dielectric isolation 32 with channel stop region 16 on the surface regions of P silicon substrate 45 to isolate monocrystalline silicon regions designated to be sites for field effect transistor devices is formed according to the procedures described in the relation to the FIG. 1 through FIG. 4 embodiment. Like numbers are indicative of like structures to the FIG. 1 through FIG. 4 embodiment.

The first insulating layer 50, polycrystalline silicon layer 52 and silicon nitride or the like second insulating layer 54 are applied to the major surface of the silicon body according to the same procedures described in regard to the FIG. 1 through 4 embodiment. However, before the deposition of layers 52, and 54 it is preferred to adjust the surface conductivity where the field effect transistors are to be formed. The threshold voltage of the field effect transistor, $V_t$, is adjusted by using for example a boron ion implantation of about $1 \times 10^{12}/cm^2$ dosage at about 70 KeV to produce surface region 55. Also, the channel stop 16 can be ion implanted at this time. In this particular embodiment the first insulating coating 50 is grown to the desired thickness of the gate dielectric which is preferably between about 20 to 200 nanometers in thickness. This layer 50 is typically formed of two parts 56 and 58 which are respectively first insulating layer silicon dioxide second insulating and silicon nitride. Where the insulating layer 50 is formed of a combination of layers of silicon dioxide and silicon nitride the thickness of these layers are, for example, of 10 to 20 nanometers silicon nitride and 10 to 40 nanometers silicon nitride. In this case the combination layer, in part, is the gate dielectric for the integrated circuit FET device being made.

Photolithography and etching techniques are utilized to form openings in third insulating layer 54 over areas designated to be the PN junction regions, such as source/drain PN regions of the field effect transistor integrated circuits. The structure is placed in a reactive ion etching ambient, as described in regard to the first embodiment, to reactively ion etch the structure so that there are resulting substantially horizontal surfaces and substantially vertical surfaces. The reactive ion etching step ends at the first insulating coating 50, as shown in FIG. 5.

The narrow dimensioned dielectric regions 60, shown in FIG. 6, are formed according to the identical procedures described in the first embodiment to form sidewall layer 30.

The source/drain regions are preferably formed by ion implantation utilizing the layer 50 as the screen insulator. The N+ source/drain regions 62 are formed by the ion implantation through the $Si_3N_4$ and $SiO_2$ layers. Alternatively, the $Si_3N_4$ can be simultaneously removed with layer 54 and subsequently implant. The implant energy depends upon the thickness of 50. The range of $1 \times 10^{18} - 10^{20}$ atoms/$cm^2$ surface concentration is desired.

The silicon nitride insulating layer 54 is now removed using a suitable etchant. The source/drain regions 62 are protected with a plastic material such as polyimide as described in relation to the first embodiment in the protection of the gate dielectric. The remaining polycrystalline silicon layer 52 is then removed by reactive ion etching or chemical etching. The polyimide layers are then removed using oxygen ashing. The formation of the conductive layer on the silicon body with portions thereof electrically separated by the narrow dimensioned regions 60 is now accomplished as described in regard to the first embodiment of FIG. 1 through 4. The source/drain contacts are 64, and the gate electrode is 66. Other interconnection metal lines 68 are shown over the isolation regions 32 as shown in FIG. 7.

Passivation and higher levels of metallurgy (not shown) are now formed upon the surfaces to passivate and interconnect the devices to form an integrated circuit as described in the description of the FIGS. 1 to 4 embodiment.

Figure 8:
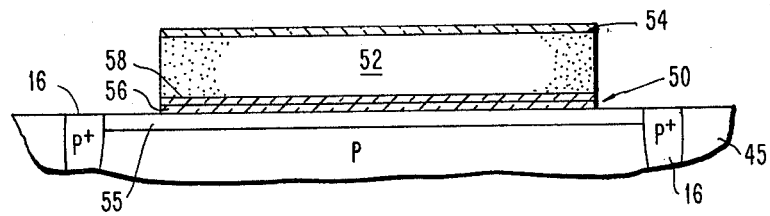
FIGS. 8 through 10 illustrate a second embodiment for fabricating a MOS field effect transistor integrated circuit according to the present invention.
Figure 9:
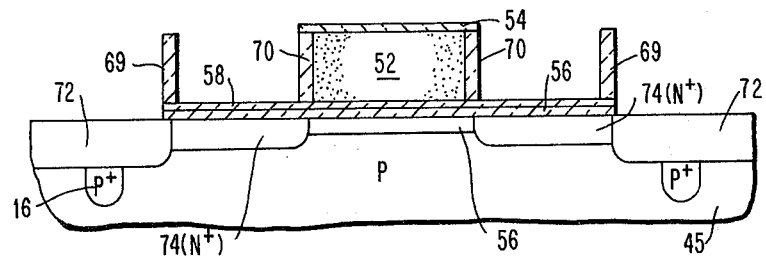
Figure 10:
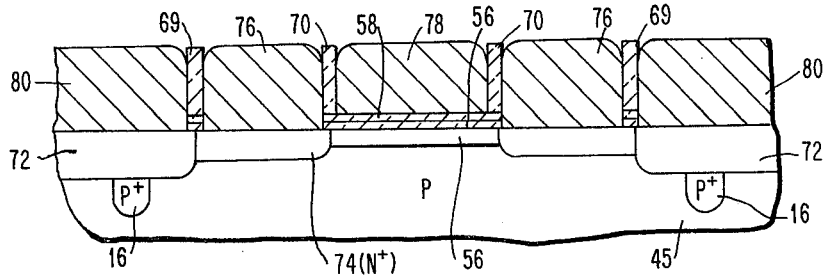

Referring now more particularly to FIG. 8 through 10 there is illustrated a second embodiment for utilizing the self-aligned metal process to form field effect transistor integrated circuits. The process is illustrated to form N channel MOSFET field effect transistor integrated circuits. However, it would be obvious that P channel field effect transistors can alternatively be formed by simply reversing the polarities of the various elements of the transistors and associated regions. The method is similar to that of the first embodiment except in the procedure for fabricating the recessed oxide isolation. Like numbers indicate like structures in the proceeding embodiments.

The first insulating coating 50, polycrystalline silicon layer 52 and silicon nitride insulating layer 54 are applied to the major surface of the silicon body according to the same procedures described in regard to the FIGS. 5 through 7 embodiment. Again the layer 50 may be a composite layer 56, 58. The threshold adjustment layer 55 and channel stop 16 are accomplished as in the FIGS. 5 to 7 embodiment. Photolithography and etching techniques are utilized to form openings in silicon nitride layer 54 over areas designated to be the isolation regions of the integrated circuit. The field effect transistor device areas remain covered with the layer 54.

The structure is placed in a reactive ion etching ambient, as described in regard to the first embodiment, to reactively ion etch the structure so that there are resulting substantially horizontal surfaces and substantially vertical surfaces. The reactive ion etching step ends at the substrate 45 as shown in FIG. 8. The reactive ion etching ambient will have to change as the various layers, i.e., polycrystalline silicon 52, silicon nitride 58 and silicon dioxide 56 are encountered as known in the art. The sidewalls of the FIG. 8 layer 52 are thermally oxidized by high pressure oxidation at approximately 700° C-25 atmospheres to produce sidewall layers 69 as shown in FIG. 9. Etching of the substrate by reactive ion etching to the desired depth of the isolation region is now done as in the FIGS. 1-4 embodiment.

Photolithography and etching techniques are used to remove layer 54 from the regions designated to have the source/drain PN junction regions. Reactive ion etching is used to remove layer 52 using the remaining layer 54 as a mask.

The next steps are used to form the sidewall layers 70 and recessed oxide isolation regions 72. It is preferred to use the process described in the FIG. 1-4 embodiment to form these layers 70 and regions 72.

The remaining layers 54 and 52 are now removed by conventional etching techniques to result in free standing sidewall layers 69 and 70. The process continues as in the FIGS. 5 to 7 embodiment to produce the FIG. 10 structure having source/drain regions 74, source/drain contacts 76, gate electrode 78 and metal lines 80.

Passivation and higher levels of metallurgy (not shown) are now formed upon the surfaces to passivate and interconnect the devices to form an integrated circuit as described in the description of the FIGS. 1 to 4 embodiment.

While the invention has been particularly shown and described with reference to the preferred embodiments thereof, it will be understood by those skilled in the art that various changes in form and detail may be made therein without departing from the spirit and scope of the invention. For example, since this technology can be applied to N channel devices and P channel devices separately, it was obvious for people skilled in the art to combine the two and develop through some additional steps a complementary FETMOS field effect transistor self-aligned metal technology.

What is claimed is:

1. Method of forming self-aligned isolation for semiconductor devices comprising:
   forming a first insulating layer on the surface of a monocrystalline substrate whose coefficient of expansion is similar to that of the substrate;
   forming an oxidation resistant second insulating layer over said first layer;
   forming a polycrystalline silicon layer over said second layer;
   forming an oxidation resistant third insulating layer over said polycrystalline silicon layer;
   removing said third insulating layer and said polycrystalline silicon layer down to said second layer to produce substantially vertical sidewalls on the remaining third insulation layer and polycrystalline silicon layer;
   wherein the said removing of said third insulating and polycrystalline silicon is in areas designated to be at least the said isolation areas in said substrate, and the remaining polycrystalline silicon covers areas of said substrate designated to have semiconductor devices formed therein;
   thermally oxidizing the exposed sidewalls of said polycrystalline silicon layer to produce a silicon dioxide sidewall layer thereon;
   removing the exposed said second layer and in turn the exposed first layer in said designated to be at least the isolation areas;
   etching grooves into the exposed said substrate using the remaining said third insulating layer and polycrystalline silicon layer as a mask;
   filing said grooves with dielectric isolation material; and
   forming devices in said substrate between said grooves filled with dielectric isolation material.

2. The method of claim 1 wherein said semiconductor devices are field effect transistors and further comprising:
   additionally after said openings with dielectric isolation removing said third layer, said polycrystalline silicon layer and said second layer in the areas designated to be at least the source/drain regions for said field effect transistors;
   forming the source/drain regions in said monocrystalline substrate using said remaining third layer and polycrystalline silicon layer as a mask;
   removing the remaining said third layer and polycrystalline silicon layer to leave the remaining portions of said silicon dioxide sidewall layer extending above said substrate;

forming openings in said first insulating layer to the elements of said field effect transistor devices; and forming a substantially planar conductive layer on said substrate which has portions thereof electrically separated by said silicon dioxide sidewall layer for contacting the said elements of said field effect transistor devices.

3. The method of claim 1 wherein said semiconductor devices are bipolar semiconductor devices and further comprising:

said monocrystalline substrate having regions designated to contain bipolar transistors wherein a subcollector with a collector reach-through and a base region is formed therein;

additionally removing the said third layer, polycrystalline silicon layer and said second layer in areas designated to be at least the emitter for said bipolar devices;

forming the emitter regions in the said substrate;

removing the remaining said third insulating layer and said polycrystalline silicon layer to leave the remaining portions of said silicon dioxide sidewall layer extending above said silicon substrate;

forming openings in said first insulating layer to the elements of said bipolar devices, and forming a substantially planar conductive layer on said substrate which has portions thereof electrically separated by said silicon dioxide sidewall layer for contacting the said elements of said bipolar devices.

4. The method of claim 1 wherein said silicon dioxide sidewall layer has a thickness of between about 0.6 to 2 micrometers.

5. The method of claim 1 wherein said first insulating layer is silicon dioxide, said second insulating layer is silicon nitride and said third insulating layer is silicon nitride.

6. The method of claim 1 wherein said removing said third insulating layer and said polycrystalline silicon layer, and etching openings into said substrate are by anisotropic etching process.

7. The method of claim 1 wherein said dielectric isolation is at least in part silicon dioxide.

8. The method of claim 7 wherein said dielectric isolation is between about 0.3 to 1 micrometers in depth.

9. The method of claim 2 wherein the conductivity imparting impurities used in the said forming the source/drain regions are N type which produces N channel field effect transistors.

10. The method of claim 9 wherein the said conductivity imparting impurities are arsenic and said forming the source/drain regions is by ion implantation.

11. The method of claim 3 wherein the conductivity imparting impurities used in the said forming the emitter regions are N type which produces NPN transistors.

12. The method of claim 11 wherein the said conductivity imparting impurities are arsenic and said forming the emitter regions are by ion implantation.

13. Method of forming self-aligned metallization for field effect transistor semiconductor devices comprising:

forming a first insulating layer on the surface of a monocrystalline silicon substrate whose coefficient of expansion is similar to that of the substrate;

forming an oxidation resistant second insulating layer over said first layer;

forming a polycrystalline silicon layer over said second layer;

forming an oxidation resistant third insulating layer over said polycrystalline silicon layer;

removing said third insulating layer and said polycrystalline silicon layer down to said second layer to produce substantially vertical sidewalls on the remaining third insulation layer and polycrystalline silicon layer;

wherein the said removing of said third insulating and polycrystalline silicon is in areas designated to be at least the source/drain regions of said field effect transistor devices and self-aligned isolation areas in said substrate;

thermally oxidizing the exposed sidewalls of said polycrystalline silicon layer to produce a silicon dioxide sidewall layer thereon;

removing the exposed said second layer and in turn the exposed first layer in said designated isolation areas;

etching grooves into the exposed said substrate using said third layer and polycrystalline silicon layer as a mask;

filling said grooves with dielectric isolation material;

removing the exposed second layer in said areas designated to be source/drain regions;

forming the source/drain regions in the exposed said silicon substrate;

removing the remaining said third insulation and polycrystalline silicon layers to leave the remaining portions of said silicon dioxide sidewall layer extending above said silicon substrate;

forming openings in said first insulating layer to the elements of said field effect transistor devices; and forming a substantially planar conductive layer on said silicon body which has portions thereof electrically separated by said silicon dioxide sidewall layer for contacting the said elements of said field effect transistor devices.

14. The method of claim 13 wherein said silicon dioxide sidewall layer has a thickness of between about 0.6 to 2 micrometers.

15. The method of claim 13 wherein said first insulating layer is silicon dioxide, said second insulating layer is silicon nitride and said third insulating layer is silicon nitride.

16. The method of claim 13 wherein said removing said third insulating layer and said polycrystalline silicon layer, and etching grooves into said silicon substrate are by anisotropic etching process.

17. The method of claim 13 wherein the conductivity imparting impurities used in the said forming the source/drain regions are N type which produces N channel field effect transistors.

18. The method of claim 13 wherein said conductive layer is composed of aluminum.

19. Method of forming self-aligned metallization for bipolar semiconductor devices comprising:

providing a monocrystalline silicon substrate having regions designated to contain bipolar transistors wherein a subcollector with a collector reach through and a base region is formed therein;

forming a first insulating layer on the surface of said monocrystalline silicon substrate over said regions designated to contain transistors whose coefficient of expansion is similar to that of the substrate;

forming an oxidation resistant second insulating layer over said first layer;

forming a polycrystalline silicon layer over said second layer;

forming an oxidation resistant third insulating layer over said polycrystalline silicon layer;

removing said third insulating layer and said polycrystalline silicon layer down to said second layer to produce substantially vertical sidewalls on the remaining third insulating layer and polycrystalline silicon layer;

wherein the said removing of said third insulating layer and said polycrystalline silicon layer is in areas designated to be at least the emitter for said bipolar devices and self-aligned isolation areas in said substrate;

thermally oxidizing the exposed sidewalls of said polycrystalline silicon layer to produce a silicon dioxide sidewall layer thereon;

removing the exposed said second layer and in turn the exposed first layer in said designated isolation areas;

etching grooves into the exposed said substrate using said third layer and polycrystalline silicon layer as a mask;

filling said grooves with dielectric isolation material;

removing the exposed second layer in said areas designated to be the said emitter for said bipolar devices;

forming the emitter in exposed silicon substrate;

removing the remaining said third insulating layer and said polycrystalline silicon layer to leave the remaining portions of said silicon dioxide sidewall layer extending above said silicon substrate;

forming openings in said first insulating layer to the elements of said bipolar devices; and forming a substantially planar conductive layer on said silicon body which has portions thereof electrically separated by said silicon dioxide sidewall layer for contacting the said elements of said bipolar devices.

20. The method of claim 19 wherein the isolation regions between said devices and between said collector reach-through and the remaining portions of each bipolar device are formed by said removing said third insulating layer and said polycrystalline silicon layer from regions designated to be said isolation regions; etching openings into said silicon substrate using the remaining said third insulating layer and said polycrystalline silicon layer as a mask; and filling said openings with dielectric isolation material.

21. The method of claim 19 wherein said silicon dioxide sidewall layer has a thickness of between about 0.6 to 2 micrometers.

22. The method of claim 19 wherein said first insulating layer is silicon dioxide, said second insulating layer is silicon nitride and said third insulating layer is silicon nitride.

23. The method of claim 19 wherein said removing said third insulating layer and said polycrystalline silicon layer, and etching openings into said silicon substrate are by anisotropic etching process.

24. The method of claim 19 wherein the conductivity imparting impurities used in the said forming the emitter regions are N type which produces NPN transistors.

25. The method of claim 19 wherein said conductive layer is composed of aluminum.

* * * * *